(12) United States Patent
Miyajima et al.

(10) Patent No.: US 6,883,770 B1
(45) Date of Patent: Apr. 26, 2005

(54) LOAD PORT MOUNTING MECHANISM

(75) Inventors: Toshihiko Miyajima, Tokyo (JP); Hiroshi Igarashi, Tokyo (JP); Tsutomu Okabe, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/572,458

(22) Filed: May 17, 2000

(30) Foreign Application Priority Data

May 18, 1999 (JP) ............................................ 11-136894
Mar. 31, 2000 (JP) ...................................... 2000-097969

(51) Int. Cl.[7] ............................................ F16M 13/00
(52) U.S. Cl. .................................. 248/544; 248/222.13
(58) Field of Search ........................... 248/544, 222.13, 248/316.2, 220.22; 414/217, 217.1, 939, 940; 280/47.24; 312/351.13, 351.14

(56) References Cited

U.S. PATENT DOCUMENTS

| | | | | |
|---|---|---|---|---|
| 4,337,988 A | * | 7/1982 | Schenck | 312/250 |
| 4,607,896 A | * | 8/1986 | Peterman | 312/201 |
| 6,082,951 A | * | 7/2000 | Nering et al. | 414/217.1 |
| 6,138,721 A | * | 10/2000 | Bonora et al. | 141/98 |
| 6,220,808 B1 | * | 4/2001 | Bonora et al. | 414/217 |

FOREIGN PATENT DOCUMENTS

| | | | | | |
|---|---|---|---|---|---|
| JP | 405074923 A | * | 3/1993 | | 414/940 |
| JP | 405090385 A | * | 4/1993 | | 414/940 |

* cited by examiner

Primary Examiner—Gwendolyn Baxter
(74) Attorney, Agent, or Firm—Oblon, Spivak, McClelland, Maier & Neustadt, P.C.

(57) ABSTRACT

A positioning member and a movable member that is to be brought into contact with the positioning member are arranged in one and the other of the load port and the semiconductor manufacture apparatus, respectively. Two pairs of such positioning members and movable members are provided. A groove (preferably V-shaped) into which the movable member is to be fitted is provided in a surface of one of the positioning member that contacts with the movable member. Furthermore, a mechanism for making it possible to adjust the position by moving the movable member in an up-and-down direction is provided to adjust the position of the movable member to thereby make it possible to perform the positional adjustment between the semiconductor manufacture apparatus and the load port. In a preferred embodiment, the positioning member is a roller which may rotate about its own shaft.

17 Claims, 10 Drawing Sheets

LOAD PORT MOUNTING MECHANISM

BACKGROUND OF THE INVENTION

1. Field of the Invention

The present invention relates to a load port for loading into a semiconductor manufacturing apparatus a clean box whose interior is kept clean in a local clean space system that is to be installed in the semiconductor manufacturing apparatus, and more particularly a mounting mechanism for mounting the load port to the semiconductor manufacturing apparatus.

2. Related Background Art

In a manufacture process that needs a high level clean circumstance, such as a recent semiconductor device manufacture, an approach so called a mini-environment or a local clean space has been made in which a whole factory is not kept clean but only the environmental circumference for the products is kept clean. In brief, the interiors of the respective devices in the process are only kept clean, and the transfer and storing of the products to be processed between the respective devices (clean devices) are performed by using a container (clean box or pod) whose interior is kept clean.

In the case where an article to be transferred such as a semiconductor wafer within a pod is transferred to the clean device such as a semiconductor wafer processing apparatus (that is, loaded), an additional device called a load port is used. This load port is a device to be mounted detachably to the clean device and normally has a mechanism for automatically opening a lid of the pod and a table on which the pod is to be laid. Since the load port serves to open the lid of the pod, it is sometimes called an opener. The load port makes it possible to open the pod to the clean space of the clean device while keeping the sealed condition to the outside and transfer the article to be transferred (semiconductor wafer or the like) within the pod to the inside of the clean device.

If repairs are performed during the breakdown of the load port, they take a long period of time for suspension of the manufacture process, and the efficiency is low. Accordingly, the load port is formed as a discrete unit that may be detachably mounted on the clean device in order to make it possible to exchange the load ports per se in the breakdown. Recently, in the semiconductor manufacture apparatus field, the standards have been established for the load ports for the wafer having a diameter of 300 mm and an interface of the semiconductor apparatus.

When the conventional load port is mounted on the clean device, the load port is laid on a lifter and transferred close to the clean device, a positioning pin provided in the clean device is finely adjusted and fitted by the operator by using an alignment mechanism having a positioning cam or the like, and a plurality of bolts are fastened.

In the above-described conventional load port, it takes a long period of time to adjust the positions of the clean device and the load port. Also, a tool is required to fasten the bolts. The work is troublesome. In a conventional typical example, it takes about one hour to remove and mount the load port. Since the manufacture process is stopped during this work, it is demanded to shorten the time for the replacement.

Also, since the fixture is performed by using the bolts, the conventional method suffers from a disadvantage that the bolts may be lost during the replacement work.

In view of the above-noted defects, an object of the present invention is to provide a load port that may be replaced for a short period of time or a mounting structure for the load port.

SUMMARY OF THE INVENTION

In order to attain this and other objects, according to the present invention, there is provided a load port mounting mechanism for a semiconductor manufacture apparatus, comprising: a positioning plate fixed to a semiconductor manufacture apparatus mounting surface of a load port and having a positioning surface at a bottom surface; and a plate receiver fixed to a load port mounting surface of the semiconductor manufacture apparatus and having a positioning surface at a top surface, wherein when the load port is to be mounted on the semiconductor manufacture apparatus, the positioning plate rides over the plate receiver in order to that the positioning surface of the positioning plate contacts with the positioning surface of the plate receiver so that the load port is positionally aligned with the semiconductor manufacture apparatus in a vertical direction.

More preferably, the load port mounting mechanism may further comprise a positioning guide fixed to the load port mounting surface of the semiconductor manufacture apparatus and having a pair of positioning surfaces disposed at an interval in the horizontal direction and opposed to each other, wherein the positioning plate has horizontally positioning surfaces at both ends in the horizontal direction of the positioning plate, and when the load port is to be mounted on the semiconductor manufacture apparatus, the positioning plate is fitted between the pair of opposed positioning surfaces of the positioning guide, and the positioning surfaces at both ends of the positioning plate are in contact with the opposed positioning surfaces of the positioning guide so that the load port is positioned in the horizontal direction relative to the semiconductor manufacture apparatus. Thus the positional alignment may be attained also in the horizontal direction.

Furthermore, the load port mounting mechanism may comprises: a second positioning plate fixed to a position above a position where the positioning plate is fixed on the semiconductor manufacture apparatus mounting surface of the load port and having positioning surfaces at both ends thereof in the horizontal direction; and a second positioning guide fixed at a position above the positioning guide on the load port mounting surface of the semiconductor manufacture apparatus and having a pair of positioning surfaces disposed at an interval in the horizontal direction and opposed to each other, wherein when the load port is to be mounted on the semiconductor manufacture apparatus, the second positioning plate is fitted between the pair of opposed positioning surfaces of said second positioning guide, and the positioning surfaces at both ends of the positioning plate are brought into contact with the opposed positioning surfaces of the positioning guide so that the load port is further positioned in the horizontal direction relative to the semiconductor manufacture apparatus. In this case, the horizontal positional alignment is performed at two positions in the up-and-down positions. Thus, it is possible to realize a higher positional alignment with higher precision.

In one mode of the invention, the load port mounting mechanism further comprises: a fixture handle provided on the load port and having shaft portion around which a screw thread is formed and a handle portion connected to the shaft portion; and on the other hand a screw hole threadedly engaged with the shaft portion around which the screw thread is formed and provided on the side of the semiconductor manufacture apparatus, wherein the shaft portion is threadedly engaged with the screw hole by manually operating the fixture handle so that the load port may be fixed to the semiconductor manufacture apparatus. Generally, a plurality of fixture handles and screw holes are provided. Thus, it is possible to readily perform the mounting operation of the load port onto the semiconductor manufacture apparatus.

Also, in one mode of the invention, the load port has a pair of carrier wheels on the bottom surface of the load port. More preferably, the load port has carrier handles that may be manually gripped when the load port is to be manually carried by using carrier wheels. Thus, it is advantageous to move the load port without using any other carrier means such as a delivery device or a lifter.

The structure described above is advantageous in performing the mounting operation of the load port quickly. But in some cases, there are differences, i.e., variations among each one component of the semiconductor manufacture apparatus and load ports, or the misalignment would occur between the load port and the semiconductor manufacture apparatus as in the case where the horizontal reference surface of the load port is not in positional alignment with the horizontal reference surface of the semiconductor manufacture apparatus when any deformation is present in the semiconductor manufacture apparatus and the load ports. In view of such cases, according to a second aspect of the present invention, there is provided a load port mounting position adjusting mechanism for adjusting a position where a load port is to be mounted on a semiconductor manufacture apparatus, comprising: a first positioning member provided in one of the load port and the semiconductor manufacture apparatus; a first movable member movable in an up-and-down direction and provided in the other one of the load port and the semiconductor manufacture apparatus than the one that is provided with the first positioning member; a first positional adjustment mechanism for adjusting a position of the first movable member in the up-and-down direction; a second positional member provided in one of the load port and the semiconductor manufacture apparatus; a second movable member movable in the up-and-down direction and provided in the other one of the load port and the semiconductor manufacture apparatus than the one that is provided with the second positioning member; and a second positional adjustment mechanism for adjusting a position of the second movable member in the upland-down direction, wherein when the load port is mounted on the semiconductor manufacture apparatus, the first movable member and the second movable member are brought into contact with the first positioning member and the second positioning member, respectively, and a groove into which the first positioning member is to be fitted is formed in a surface of the first movable member in contact with the first positioning member.

According to this second aspect of the invention, the first positioning member is inserted into the groove, the load port is suitably aligned in the horizontal direction relative to the semiconductor manufacture apparatus, the first and second movable members and the first and second positioning members are brought into contact with each other to thereby perform: the positional alignment of the load port in the horizontal direction relative to the semiconductor manufacture apparatus, and the positions of the first and second movable members are varied by the first and second positional adjustment mechanisms to perform the fine adjustment of the position of the load port to the semiconductor manufacture apparatus.

In the above-described load port mounting position adjusting mechanism, the first and second positioning members may be rollers that may rotate about their own shafts. The use of the rollers is advantageous, since positional alignment may be performed smoothly when the load port is to be mounted on the semiconductor manufacture apparatus.

In the above-described load port mounting position adjusting mechanism, it is preferable that the first and second positioning members (rollers) be provided in the load port and the first and second movable members be provided in the semiconductor manufacture apparatus. Such a construction is advantageous, since the adjustment by the positional adjustment mechanism is dispensed with when the load port is replaced by the same kind of the load port.

In the above-described load port mounting position adjusting mechanism, the load port may be further provided with a tilt adjustment mechanism for adjusting a tilt of a surface of the semiconductor manufacture apparatus on which the load port is to be mounted (i.e., the tilt of the surface as viewed from a side of the mounting surface of the semiconductor manufacture apparatus with the load port).

Also, the present invention is also directed to the load port having the components constituting the above-described positional adjustment mechanisms and the semiconductor manufacture apparatus, respectively.

Incidentally, in this specification, the semiconductor manufacture apparatus means all the apparatus for performing any processing steps for manufacturing the semiconductor devices.

BRIEF DESCRIPTION OF THE DRAWINGS

FIG. 1A is a top view of a positional alignment mechanism of an upper portion of the load port, FIG. 1B is a front view of the load port and FIG. 1C is a bottom view of a positional alignment mechanism of a lower portion of the load port;

DESCRIPTION OF THE PREFERRED EMBODIMENTS

A load port and a load port mounting structure according to the present invention will now be described with reference to the accompanying drawings.

Figures 1A, 1B, 1C:
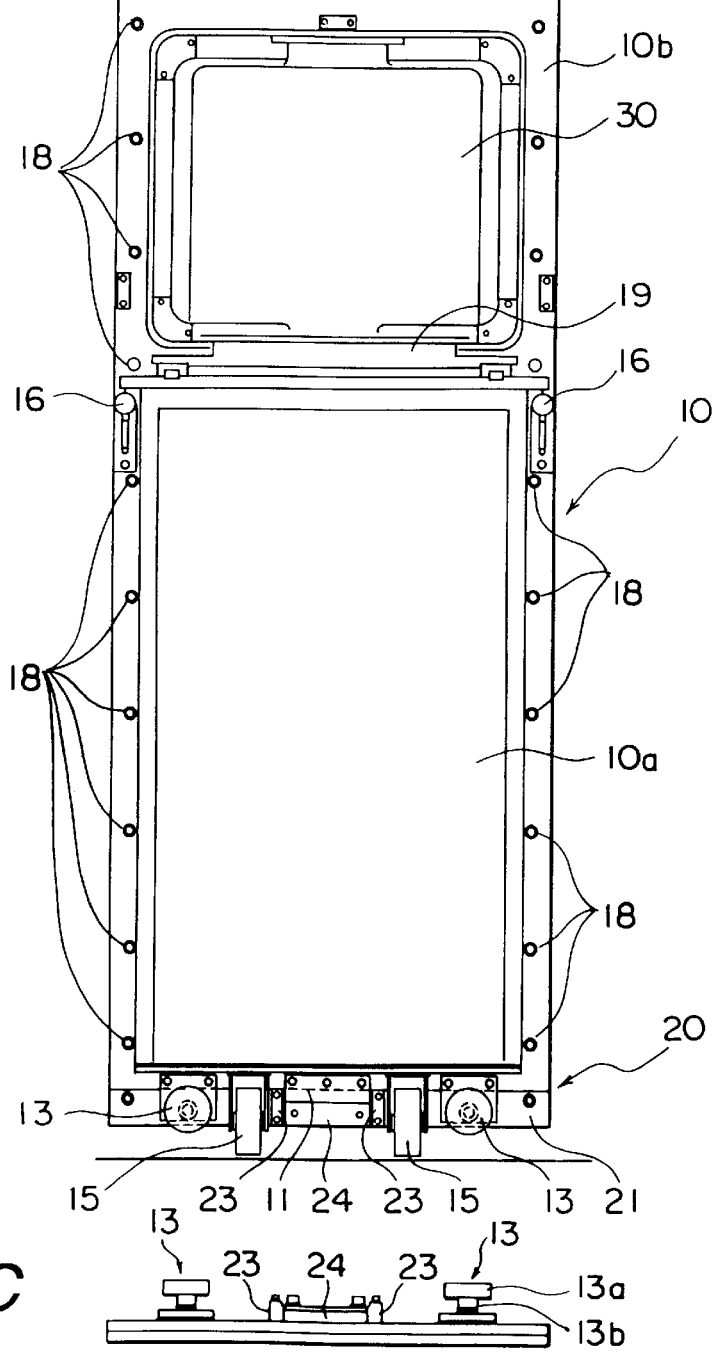
FIGS. 1A, 1B and 1C are views showing an overall structure of a load port according to a first embodiment of the present invention.
Figure 2:
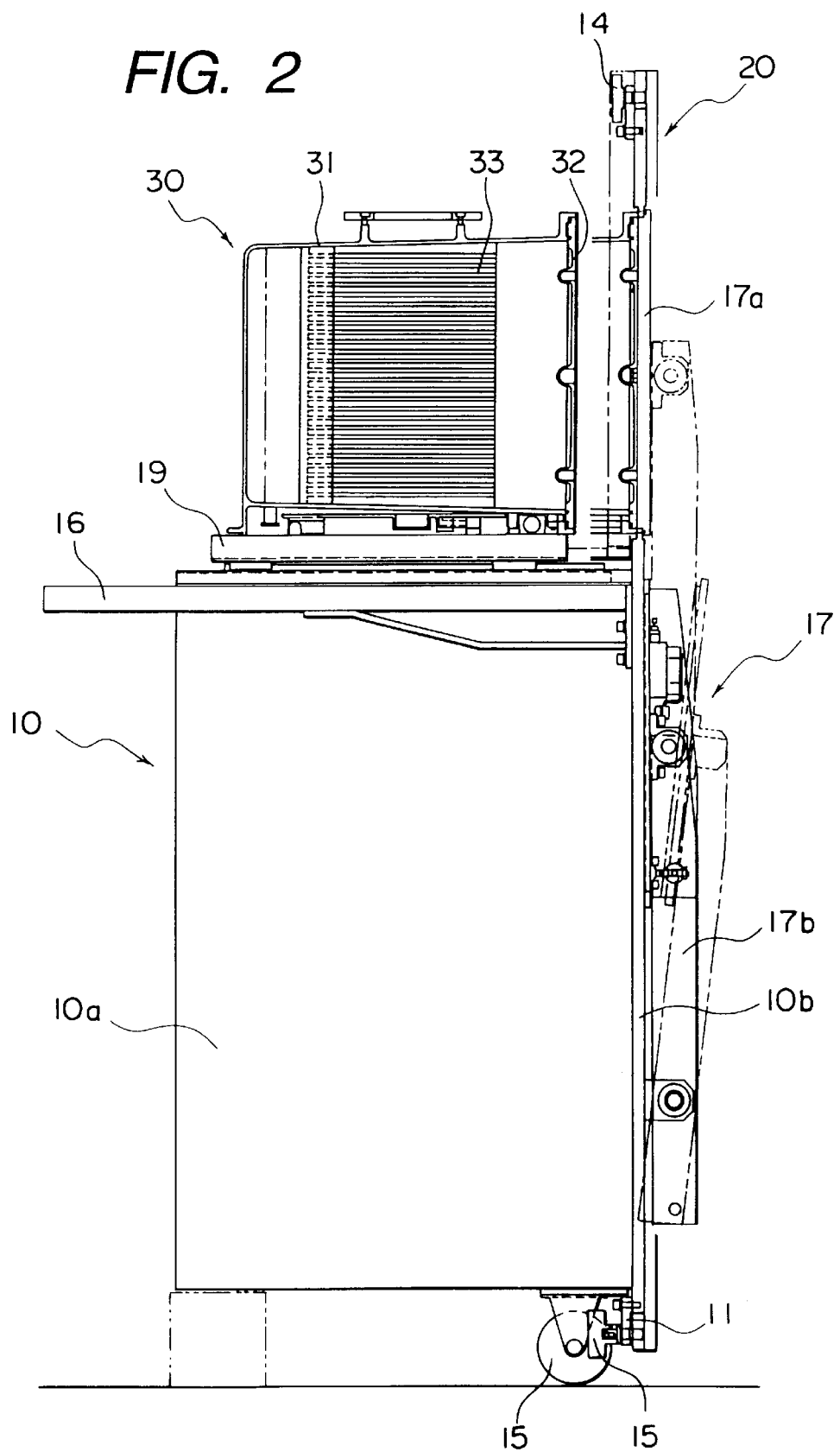
FIG. 2 is a sidle elevational view showing an overall structure of the load port as in FIGS. 1A to 1C.

FIGS. 1A to 1C and FIG. 2 are views showing the overall structure of the load port according to the present invention. FIG. 1A is a top view of a positioning mechanism of the upper portion of the load port, FIG. 1B is a frontal view of the load port, FIG. 1C is a bottom view of a positioning mechanism of the lower portion of the load port, and FIG. 2 is a side elevational view.

The load port 10 is mounted on a load port mounting surface of a semiconductor manufacture apparatus 20. FIG. 1B only shows a lower flange 21 and an upper flange 22 of the load port mounting surface of the semiconductor manufacture apparatus 20. The load port mounting surface of the semiconductor manufacture apparatus 20 has an opening between the upper flange 22 and the lower flange 21 for receiving, a mechanism 17, as shown in FIG. 2, for opening a lid of a pod provided in the load port 10.

The load port 10 has a base plate 10b on the side to be mounted on the semiconductor manufacture apparatus and a box portion 10a provided so as to project the base plate 10b. A load port table 19 is provided on a top surface of the box portion 10a of the load port, and the pod 30 is to be laid on the load port table 19.

The pod 30 has a pod body 31 opened to the side and a lid 32 for closing the opening. A shelf-like carrier 33 is disposed in the pod body 31. A plurality of semiconductor wafers are kept approximately in parallel and at an equal interval on the carrier 33.

The load port 10 has a mechanism 17 for opening/closing the lid 32 of the pod 30 outside of the base plate 10b. The lid opening/closing mechanism 17 is provided with a suction plate 17a for sucking the lid 32 of the pod 30 and an arm 17b for moving the suction plate 17a. The suction plate 17a together with the lid 32 is drawn into the semiconductor manufacture apparatus (on the right side of FIG. 2) by the arm 17b under the condition that the lid 32 of the pod 30 is sucked by the suction plate 17a so that the pod 30 is opened and the semiconductor wafers in the pod 30 may be unloaded. The detail of the lid mechanism 17 is not directly related to the present invention, and hence the explanation thereof will be omitted.

A drive source for driving the lid mechanism 17 and various units for replacing gas within the pod 30 if necessary are housed in the box portion 10a of the load port 10.

Wheels 15 to be used when the load port 10 is to be moved are mounted on the bottom surface of the box portion 10a of the load port 10. Carrier handles 16 are provided on both sides of the upper portion of the box portion 10a. In the case where the load port 10 is removed away from the semiconductor manufacture apparatus and moved, the operator grips the carrier handles 16 by his hands so that the load port 10 may be carried by the wheels 15 by one person.

A lower positioning plate 11 for alignment with the semiconductor manufacture apparatus 20 is attached to the lower end portion of the base plate 10b of the load port 10 by screws. On the other hand, a lower positioning guide 23 and a plate receiver 24 are fixed to the lower flange 21 of the semiconductor manufacture apparatus 20. Also, an upper positioning plate 12 is fixed to the upper end portion of the base plate 10b of the load port 10. Correspondingly, an upper positioning guide 25 is fixed to the upper flange 22 of the semiconductor manufacture apparatus 20. These positioning structures will be described later in detail.

The load port 10 further has screw handles 13 and 14 for fixing the load port 10 to the semiconductor manufacture apparatus 20 at the upper and lower portions, respectively. The screw handles 13 and 14 have shaft portions 13b and 14b coaxial with large diameter handle portions 13a and 14a. Screw threads are formed at peripheral portions of tip ends of the shaft portions 13b and 14b. When the load port 10 is aligned with the semiconductor manufacture apparatus 20, the shaft portions 13b and 14b of the screw handles 13 and 14 are in alignment with screw holes (not shown) provided in the upper and lower flanges 21 and 22. Under this condition, the handle portions 13a and 14a are rotated so that the shaft portions 13b and 14b are screwed into the screw holes and the load port 10 is fixed to the semiconductor manufacture apparatus 20. Serrations or knurl for preventing the slippage are provided on the outer circumferential surfaces of the handle portions 13a and 14a.

Figure 3:
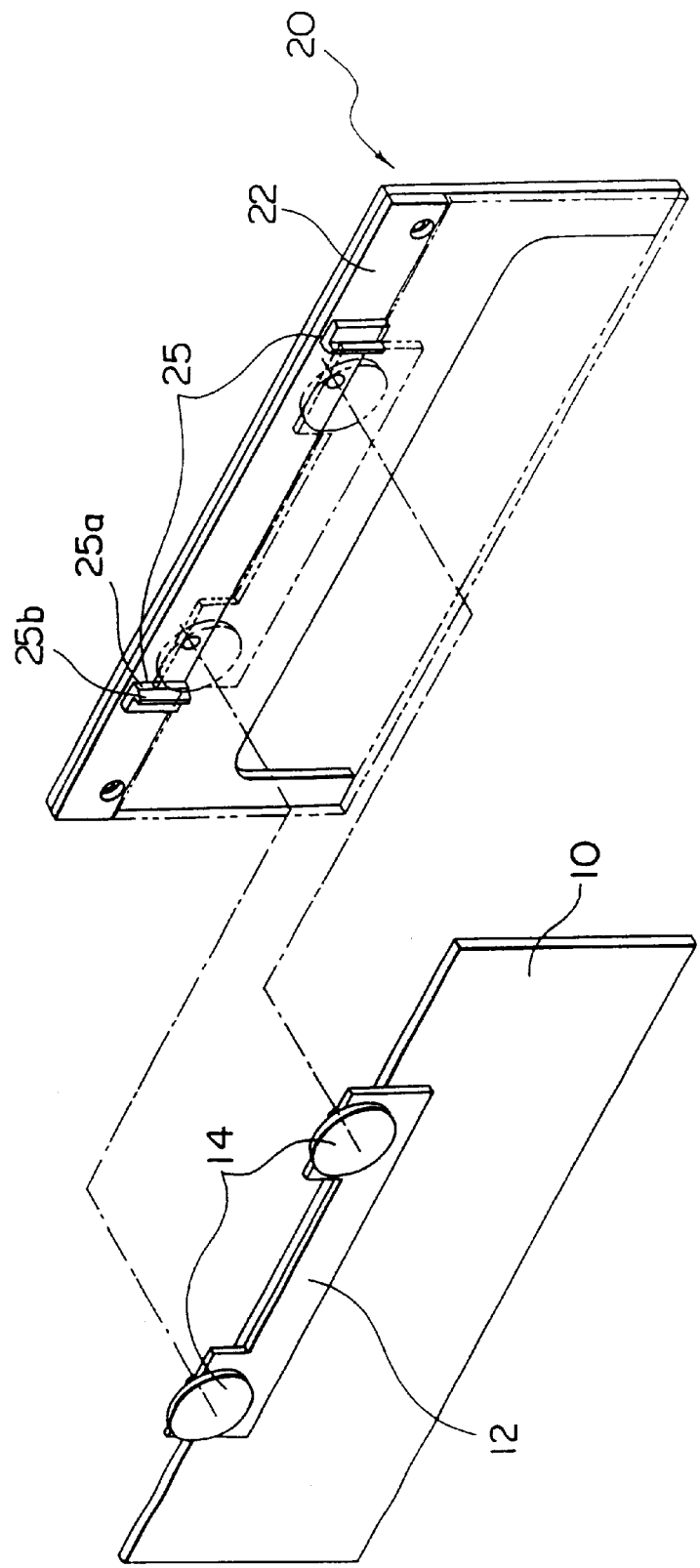
FIG. 3 is a perspective view showing a positioning mechanism of respective upper portions of the load port and the semiconductor manufacture apparatus.

The structure for positioning the upper portion of the load port 10 will next be described in detail with reference to FIG. 3. FIG. 3 is a perspective view showing the positioning mechanism for the upper portions of the load port 10 and the semiconductor manufacture apparatus 20, respectively.

A pair of upper positioning guides 25 are fixed to the upper flange 22 of the semiconductor manufacture apparatus 20. This serves to position the load port 10 and the semiconductor manufacture apparatus 20 in place in cooperation with the upper positioning plate 12 fixed to the upper portion, of the base plate 10b of the load port 10. The pair of upper positioning guides 25 position the load port 10 to the semiconductor manufacture apparatus 20 with respect to the right and left directions by receiving the upper positioning plate 12 between the pair of positioning surfaces 25a. In other words, the upper positioning plate 12 is fit between the pair of upper positioning guides 25 so that the load port 10 is positioned with respect to the horizontal direction to the semiconductor manufacture apparatus 20. In this case, both end surfaces, in the horizontal direction, of the upper positioning plate 12 constitute the positioning surfaces, whereby they cooperates with the pair of positioning surfaces of the upper positioning guides 25 to perform the alignment. Tapers 25b are added to portions of the above-described inside surfaces 25a of the upper positioning guides 25 for facilitating the insertion of the upper positioning plate 12.

Figure 4:
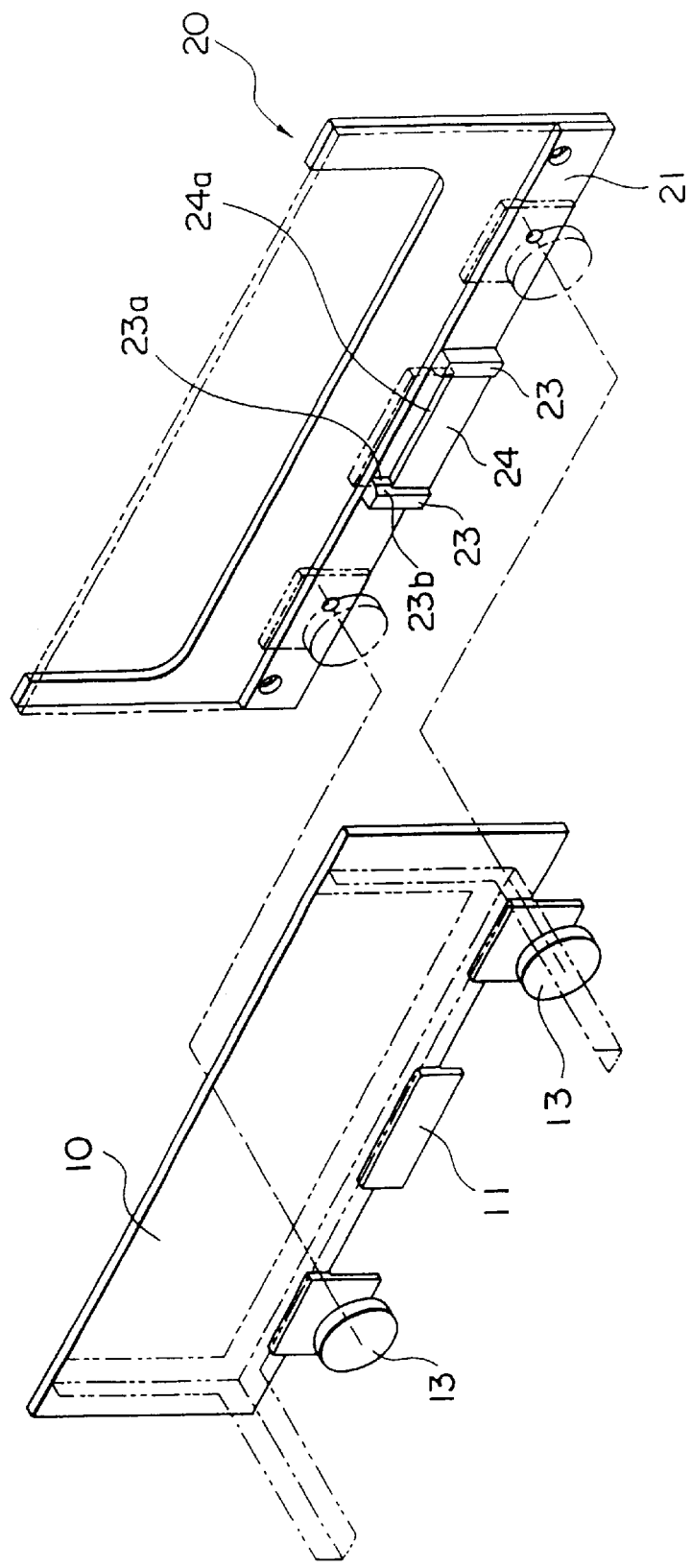
FIG. 4 is a perspective view showing a positioning mechanism of respective lower portions of the load port and the semiconductor manufacture apparatus.

FIG. 4 is a perspective view showing the lower positioning mechanism for the load port 10 and the semiconductor manufacture apparatus 20 respectively.

A pair of lower positioning guides 23 and a plate receiver 24 are fixed to the lower flange 21 of the semiconductor manufacture apparatus 20. These cooperate with the lower positioning plate 11 fixed on the base plate 10b of the load port 10 to perform the positional alignment between the load port 10 and the semiconductor manufacture apparatus 20. The lower positioning plate 11 is inserted in between the lower positioning guides 23 and rides over the plate receiver 24 so that the load port 10 is positioned with respect to the horizontal direction and the vertical direction relative to the semiconductor manufacture apparatus 20. More specifically, the lower positioning plate 11 is positioned with respect to the horizontal direction by a pair of positioning surfaces (inside surfaces) 23a of the lower positioning guides 23 facing each other and is positioned with respect to the vertical direction by the upper positioning surface 24a of the plate receiver 24. The surfaces of both ends in the horizontal direction and the lower surface of the lower positioning plate 11 constitute the positioning surfaces in correspondence with these two directional alignment. Tapers 23b are provided on portions of the inside surfaces 23a of the lower positioning guides 23 for facilitating the insertion of the lower positioning plate 11.

The operation when the load port 10 is to be mounted on the semiconductor manufacture apparatus 20 will next be explained with reference to FIGS. 5A to 5C which are views for schematically illustrating the operation of mounting the load port 10 onto the semiconductor manufacture apparatus 20 and are views depicting the side surfaces of the portions of the load port 10 and the semiconductor manufacture apparatus 20 cooperating with each other.

Since the load port 10 is provided with the wheels 15 at its bottom, the carrier handles 16 are gripped and pushed (or pulled) by hands so that the load port 10 may be manually moved without needs to use any other carrier. When the thus moved load port 10 is to be mounted on the semiconductor manufacture apparatus 20, first of all, the operator tilts the load port 10 forwardly (by gripping the handles 16 shown in FIG. 1 B) as shown in FIG. 5A. As apparent from the dotted line L of FIG. 5A, this tilt has to be in a position such that the lower end of the lower positioning plate 11 of the load port 10 is higher in level than the upper end of the plate receiver 24 fixed to the lower flange 21 of the semiconductor manufacture apparatus 20.

Figure 5:
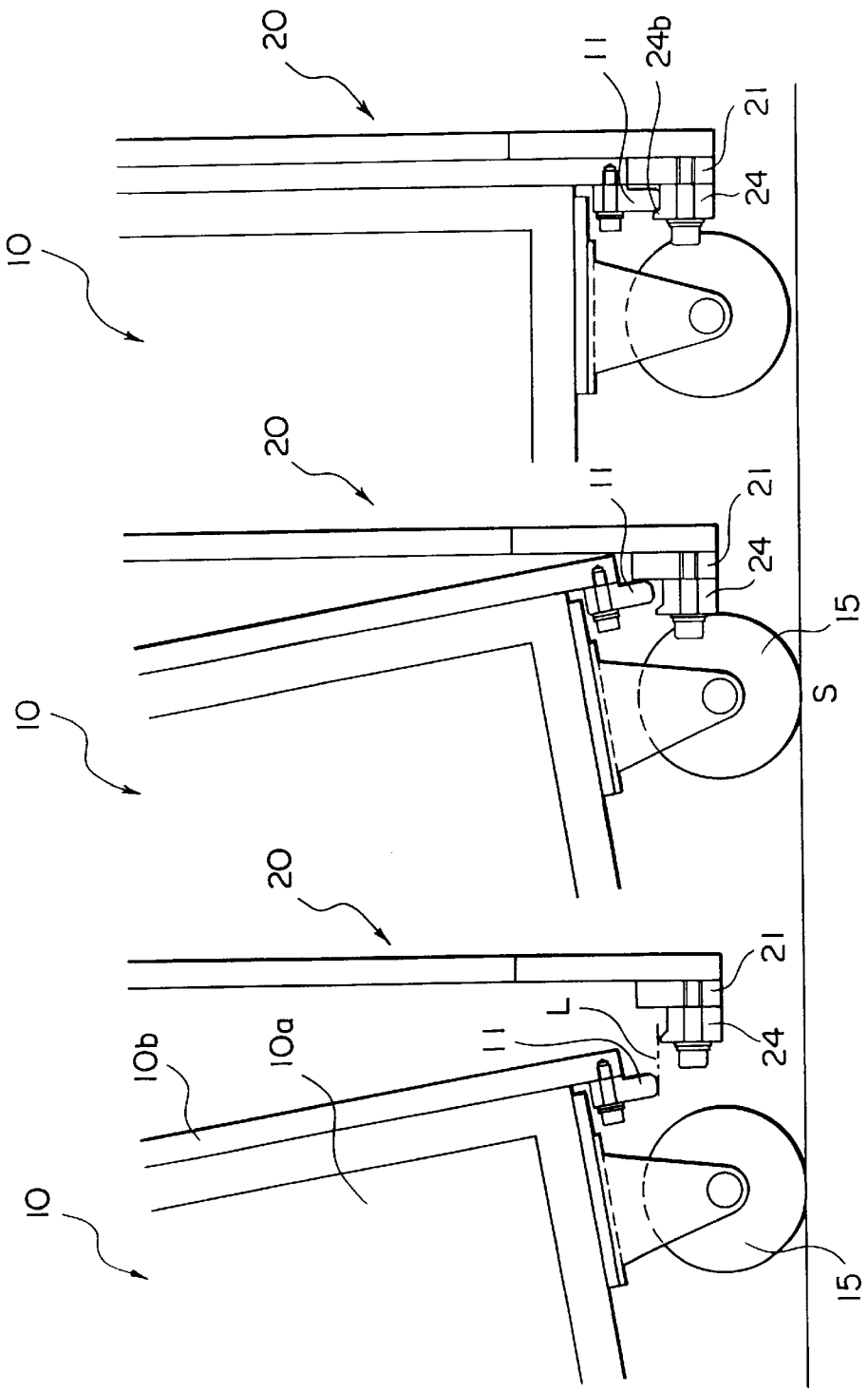
FIGS. 5A, 5B and 5C are views illustrating the operation of mounting the load port onto the semiconductor manufacture apparatus and views depicting side elevations of the parts cooperating with each other in the lower portions of the load port and the semiconductor manufacture apparatus.

Under this conditions, the load port 10 is pushed to the position of FIG. 5B close to the semiconductor manufacture apparatus 20. In the condition of FIG. 5B, the carrier handles 16 are lifted up so that the load port 10 is rotated about a contact S between the wheels 15 and the floor functioning as a fulcrum and the lower surface of the lower positioning plate 11 of the load port 10 is brought into contact with the upper surface of the plate receiver 24 of the semiconductor manufacture apparatus 20. Thereafter, the load port 10 is pivoted on the pivot of the contact point between the lower positioning plate 11 and the plate receiver 24. The lower positioning plate 11 of the load port 10 is seated under the condition of being in positional alignment with the plate receiver 24 of the semiconductor manufacture apparatus 20. At this time, simultaneously, the upper positioning plate 12 of the load port 10 of FIG. 3 is inserted in a predetermined position between the positioning guides 25 of the semiconductor manufacture apparatus 20.

In this case, the base plate 10b of the load port 10 is held in positional alignment and contact with the load port mounting surface of the semiconductor manufacture apparatus 20. Incidentally a load port side edge portion of the upper portion of the plate receiver 24 is formed into a projected edge 24b that projects somewhat upwardly so as to prevent the lower positioning plate 11, laid thereon, from being pulled apart.

Then, the operator manually turns the upper screw handles 14 shown in FIG. 3 to fix the load port 10 to the semiconductor manufacture apparatus 20 by one hand while keeping the condition by gripping the carrier handle 16 shown in FIG. 2 by the other hand. If the upper screw handles 14 are fastened in place, there is no problem if he release the carrier handles 16. Accordingly, subsequently, the operator inserts his hand from the side to turn the lower screw handles 13 to fix the lower portion of the load port 10.

Thus, the load port 10 is fixed in a predetermined position relative to the semiconductor manufacture apparatus 20.

Bolts may be inserted into all or some of screw holes 18 provided around the periphery of the base plate of the load port 10 if necessary. In this case, the fixture by the screw handles 13 and 14 means a temporary fixture.

Thus, it is possible to mount the load port 10 onto the semiconductor manufacture apparatus 20.

In the case where the load port 10 is removed away from the semiconductor manufacture apparatus 20, the opposite steps to those described above will be taken. Namely, the following steps will be taken.

First of all, if the bolts are screwed in the screw holes 18, all of them are removed.

Subsequently, the lower screw handles 13 are turned to release the fixture in the lower portion.

Subsequently, the upper handles 14 are turned while the operator holding the carrier handles 16, thereby releasing the upper fixture.

Subsequently, the load port 10 is tilted as shown in FIG. 5B by using the carrier handles 16.

If the lower end of the lower positioning plate 11 is tilted so that it is higher in level than the projecting edge 24b of the plate receiver 24 of the semiconductor manufacture apparatus 20, the carrier handles 16 are pulled backwardly, and the load port 10 is moved by the wheels 15 so that it is pulled apart from the semiconductor manufacture apparatus 20 as shown in FIG. 5A.

Thus, it is possible to remove the load port 10 away from the semiconductor manufacture apparatus 20.

In the actual experiments, when the load ports 10 were replaced in accordance with the above-described steps, it was possible to perform the replacement work in about ten minutes, which had taken about one hour in the conventional apparatus.

In the foregoing embodiment, the load port is of a type in which the wafers are removed in the lateral direction from the side surface of the pod. However, the present invention is not limited thereto or thereby but it is possible to apply the present invention to the load port in which the wafers are removed downwardly from the bottom surface of the pod.

In the above-described load port mounting mechanism in accordance with the embodiment, it is possible to align the load port and the semiconductor manufacture apparatus with each other with ease only by riding the positioning plate over the plate receiver without needs of the intricate positional work by the positional plate provided in the load port and the plate receiver provided in the semiconductor manufacture apparatus.

It is possible to readily perform the horizontal alignment only by inserting the positional plate into the positional guides by the positional surfaces provided on both end faces in the horizontal direction of the positional plate and the positional guides on the semiconductor manufacture apparatus.

Also, the wheels are provided on the load port to thereby dispense with the carrier for delivery and it is unnecessary to use a lifter even in mounting operation.

Furthermore, the fixture handles for performing the fixture of the load port to the semiconductor manufacture apparatus are provided whereby it is possible to dispense with the tool for fastening the bolts or the fixture work may be performed by only one person. Also, there is no concern of losing the bolts.

In the load port mounting mechanism according to the foregoing embodiment, it is possible to mount and remove the load port in the very simple steps, and in addition, it is possible to mount and remove the load port by only one person without using any auxiliary device such as a lifter or the like. Furthermore, it is possible to shorten a time needed to mount (to replace) the load port. Thus, it is possible to quickly replace the load ports in case of a trouble in the load ports to thereby considerably reduce the downtime of the process.

A second embodiment of the present invention will now be described with reference to FIGS. 6 to 8.

Figure 6:
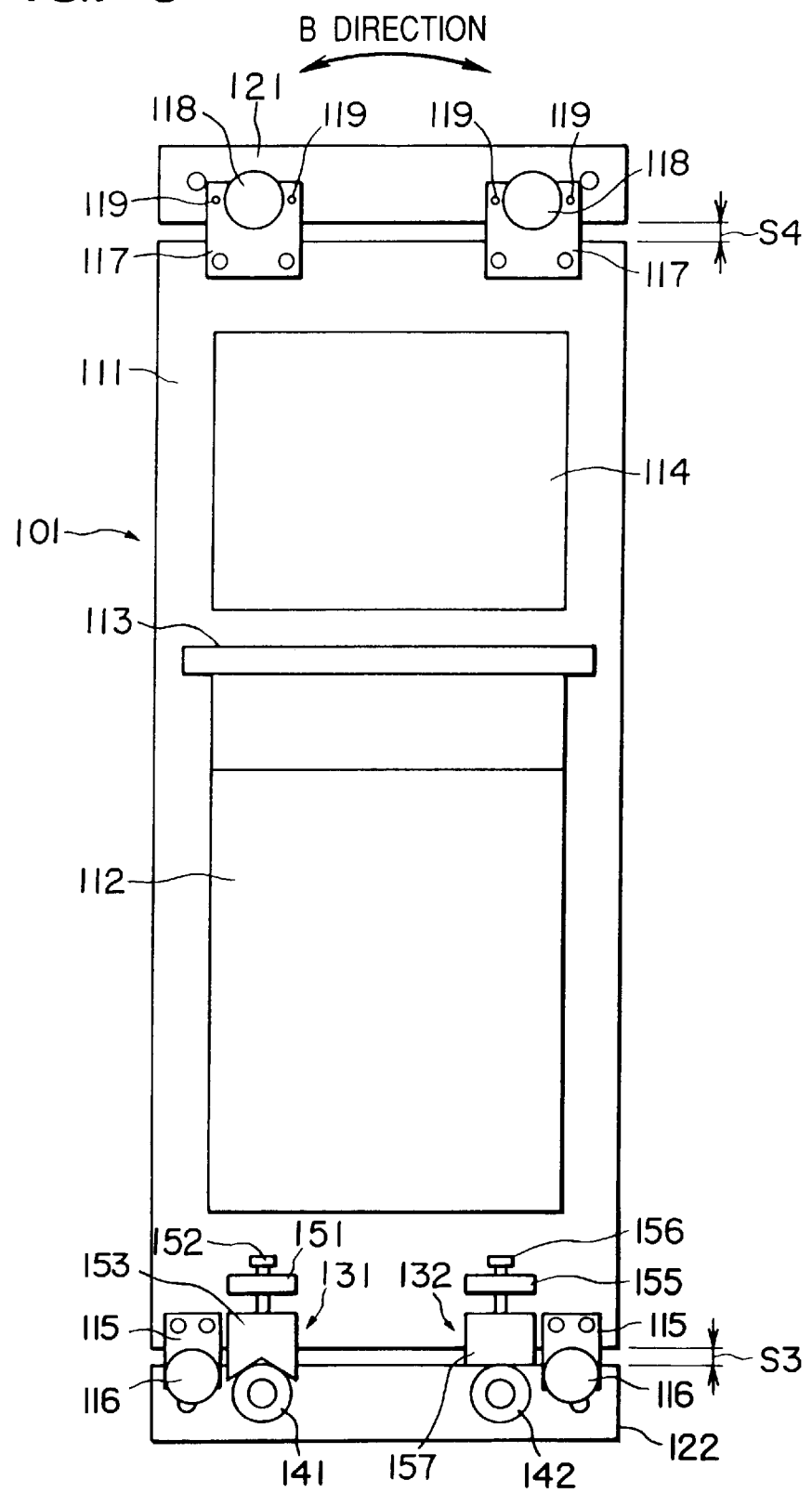
FIG. 6 is a front view showing the load port and the load port mounting portion of the semiconductor manufacture apparatus according to a second embodiment of the present invention.
Figure 7:
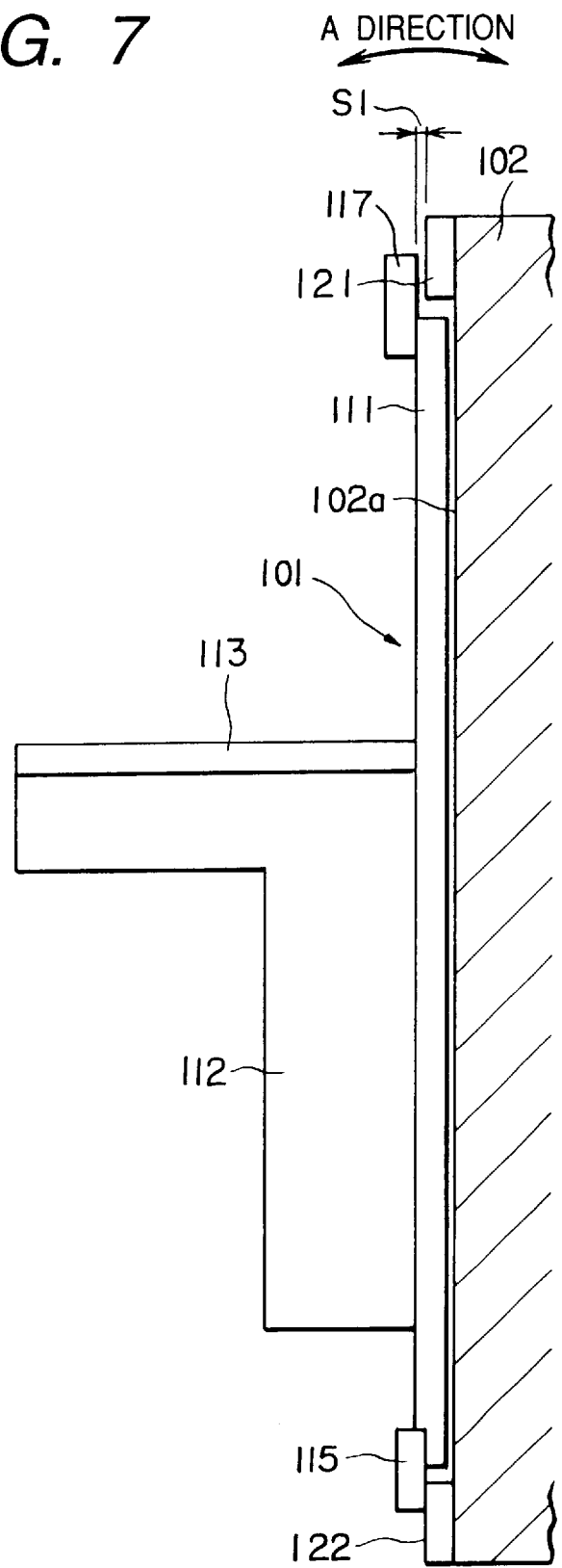
FIG. 7 is a side elevational view showing the load port and the load port mounting portion of the semiconductor manufacture apparatus according to a second embodiment of the present invention.
Figure 8:
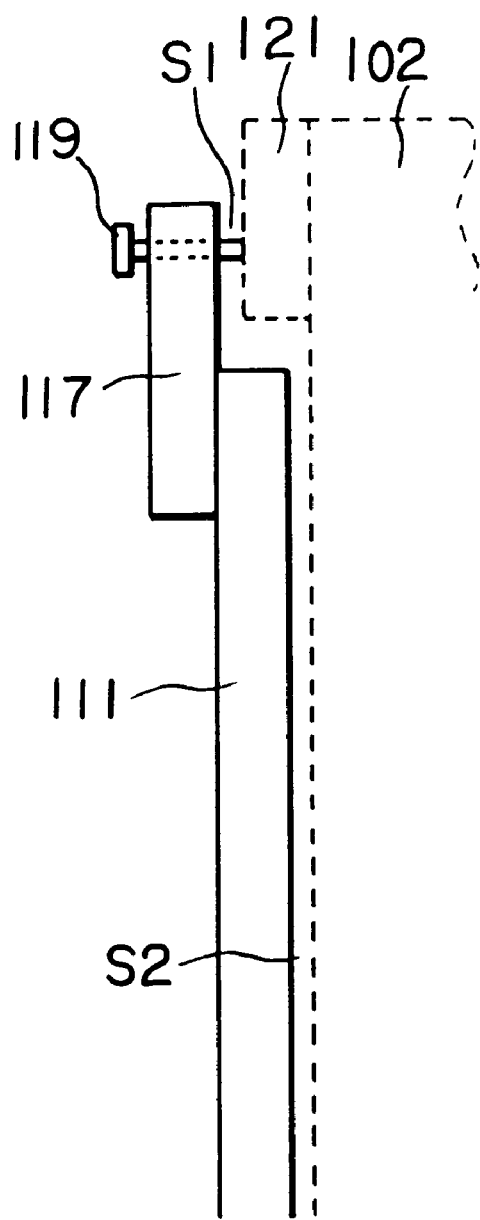
FIG. 8 is a side elevational view showing a tilt adjustment mechanism of the upper portion of the load port.

FIG. 6 is a frontal view showing a load port and a load port mounting portion of the semiconductor manufacture apparatus, and FIG. 7 is a side elevational view thereof.

As shown in FIG. 7, the load port 101 is to be mounted on a load port mounting surface 102a of the semiconductor manufacture apparatus 102. The load port 101 takes such a structure that a box portion 112 is mounted on a base plate 111. A load port table 113 on which the clean box (not shown) is to be laid is provided on the upper surface of the box portion 112. The load port table 113 has a well know mechanism for holding the clean box (or pod) so that the opening of the clean box is in alignment with an opening 114 of the base plate 111 in a predetermined position. An air cylinder and the like are received in the box portion 112 as a power source of a mechanism for opening the box so that the lid of the clean box laid on the load port table 113 is retracted into the semiconductor manufacture apparatus 102. As well known, the lid of the clean box laid on the load port table 113 is retracted into the semiconductor manufacture apparatus 102 together with the door of the semiconductor manufacture apparatus 102 so that the semiconductor wafers within the clean box can be transferred into the semiconductor manufacture apparatus 102.

The rectangular opening 114 is formed in the upper portion of the base plate 111. When the load port 101 is mounted on the semiconductor manufacture apparatus 102, the opening 114 is in alignment with an opening (not shown, and usually closed with a door which is not shown neither) provided in the load port mounting surface 102a of the semiconductor manufacture apparatus 102 and serves as a transfer inlet port of the semiconductor wafers from the clean box to the semiconductor manufacture apparatus 102.

Lower brackets 115 and upper brackets 117 for respective pairs of screw handles are fixed to the lower and upper portions of the base plate 111 with bolts. These brackets 115 and 117 have holes. Screw handles 116 (lower portion) and screw handles 118 (upper portion) having shaft with screw threads are caused to pass through the holes. The screw handles 116 and 118 serve to manually fix the load port 101 to the semiconductor manufacture apparatus 102. The fixture steps will be described later (Incidentally, in FIG. 7, the screw handles are omitted).

A first positional adjustment mechanism 131 and a second positional adjustment mechanism 132 for performing the relative alignment between the load port 101 and the semiconductor manufacture apparatus 102 are provided in the lower portions of the load port 101 and the semiconductor manufacture apparatus 102.

In the structure shown in FIG. 6, the first positioning mechanism 131 is composed of a first roller 141 (first positioning member) mounted rotatably on a lower plate 122 and a first positional adjustment mechanism provided on the load port 101. The first positional adjustment mechanism includes a screw bracket 151 fixed to the base plate 111 of the load port 101, an adjustment screw 152 screwed with the screw bracket 151, and a first movable member 153. The first movable member 153 rides over the first roller 141 and comes into contact with the first roller 141 to serve as a first positioning member for determining the positional relationship between the load port 101 and the semiconductor manufacture apparatus 102. A head portion of the adjustment screw 152 is hexagonal, for example, and may be turned by a hexagonal wrench. The adjustment screw 152 is moved up and down by its rotation. The first movable member 153 is guided to move only in the up-and-down direction by a guide (not shown) so that the up-and-down (or vertical) position thereof may be changed in response to the advance or retraction in the up-and-down direction of the adjustment screw 152.

A V-shaped groove is provided on the bottom surface (i.e., the surface that comes into contact with the roller 141) of the first movable member 152. When the load port 101 is to be mounted on the semiconductor manufacture apparatus 102, the roller 141 is fitted into the V-shaped groove.

The second positioning mechanism is composed of a second roller 142 (second positioning member) on the semiconductor manufacture apparatus 102 and a second positional adjustment mechanism on the load port side in the same way as in the first positioning mechanism. The second positional adjustment mechanism includes a bracket 155, an adjustment screw 156 and a second movable member 157. The structure of the second positional adjustment mechanism is substantially the same as that of the first positional adjustment mechanism. The only difference is that the V-shaped groove is formed on the lower surface of the first movable member 153 of the first positional adjustment mechanism, whereas the surface of the bottom of the second movable member 157 is flat. The second movable member 157 rides over the second roller 142 serving as a second positioning member for determining the positional relationship between the load port 101 and the semiconductor manufacture apparatus 102. A head portion of the adjustment screw 156 is hexagonal, for example, and may be turned by a hexagonal wrench. The adjustment screw 156 is moved up and down by rotation. The second movable member 157 is guided to move only in the up-and-down direction by a guide (not shown) so that the up-and-down position thereof may be changed in response to the advance or retraction in the up-and-down direction of the adjustment screw 156. (Incidentally, in FIG. 7, the first and second positioning mechanisms are omitted.)

A mechanism for adjusting the tilt of the load port 101 is provided in each bracket 117 in the upper part of the load port 101. This serves to adjust the tilt of the load port 101 in the direction indicated as A DIRECTION in FIG. 7. This tilt adjustment mechanism includes a pair of adjustment screws 119 for engaging with a pair of screw holes provided in the two upper brackets 117. This mechanism will now be described with reference to FIG. 8 which is a side elevational view showing the uppermost portion of the load port 101 on an enlarged scale. An A-direction adjustment screw 119 is threadedly engaged with the upper bracket 117 of the load port 101. The screw 119 is turned so that the screw 119 is retracted and advanced in the right and left directions, i.e., in-the horizontal direction, and a length that the screw 119 projects from the back side of the upper bracket 117 may be changed. Thus, it is possible to limit the interval S1 between the upper bracket 117 and the upper plate 121 of the semiconductor manufacture apparatus 102 when the load port 101 is mounted on the semiconductor manufacture apparatus 102. Under the condition that the load port 101 is mounted on the semiconductor manufacture apparatus 102, the adjustment is performed, thereby the tilt of the load port 101 is adjusted in the direction indicated by the arrow A in FIG. 7 and the distance S2 between the load port 101 and the semiconductor manufacture apparatus 102 may be adjusted.

The steps for mounting the load port 101 described above onto the semiconductor manufacture apparatus 102 will now be described.

Normally, the load port is carried by using a carrier having wheels. Alternatively, it is possible to carry the load port with providing the wheels for the load port itself. When the load port 101 having been carried is mounted on the semiconductor manufacture apparatus 102, the first and second movable members 153 and 157 ride over the roller 141 and the roller 142 provided on the lower portion of the semiconductor manufacture apparatus 102, respectively. In this case, the first roller 141 is fitted into the V-shaped groove of the lower portion of the first movable member 153. Since the rollers 141 and 142 are rotatable about their own shafts, even if the load port 101 and the semiconductor manufacture apparatus 102 are somewhat offset from each other in the lateral direction, the rollers rotate along and on the first and second movable members to thereby cause the roller 141 to readily enter the V-shaped groove of the first movable member to bring the load port 101 into a suitable position. Thus, the load port 101 is suitably positioned in the horizontal direction relative to the semiconductor manufacture apparatus 102 and is also positioned in the vertical direction substantially in the suitable position. However, there are differences or individualities among the load ports or the semiconductor manufacture apparatus, as a matter of fact, the further positional adjustment is to be effected in order to align the levels of the horizontal reference surface of the load port with the horizontal reference surface of the semiconductor manufacture apparatus.

In this case, first of all, the adjustment screw 152 on the side of the first positional adjustment mechanism 131 is caused to turn by using a wrench or the like, to adjust the height of the first movable member 153 to adjust the height of the load port 101 relative to the semiconductor manufacture apparatus 102. Subsequently, the adjustment screw 156 of the second positional adjustment mechanism 132 is rotated to change the height of the second movable member 157 to adjust the tilt of the load port 101. This is the adjustment of the tilt in the direction indicated by the arrow B in FIG. 6. As shown in FIG. 6, under the condition that the first movable member 153 and the second movable member 157 ride over the rollers 141 and 142, respectively, minute gaps S3 and S4 are formed between the upper and lower portions of the base plate 111 of the load port 101 and the upper and lower plates 121 and 122 of the semiconductor manufacture apparatus 102. Thus, the fine adjustment of the relative position between the load port 101 and the semiconductor manufacture apparatus 102 by the first and second positional adjustment mechanism is possible. More specifically, the gaps S3 and S4 are set at, for example, 2 millimeters.

The A-direction adjustment screw of the upper portion is rotated to thereby adjust the tilt in the A-direction after the above-described adjustment has been completed or before the above-described adjustment has been completed.

When the above-described three kinds of adjustments, i.e., the height adjustment by the adjustment screw 152, the B-direction adjustment by the adjustment screw 156 and the A-direction adjustment by the screw 119 are completed to thereby position correctly the load port 101 and the semiconductor manufacture apparatus 102, then, the screw handles 116 and 118 at the four positions in the upper and lower positions are manually rotated and inserted into the screw holes (not shown) of the lower and upper plates 115 and 117 of the semiconductor manufacture apparatus 102 to fix the load port 101 to the semiconductor manufacture apparatus 102.

Figure 9:
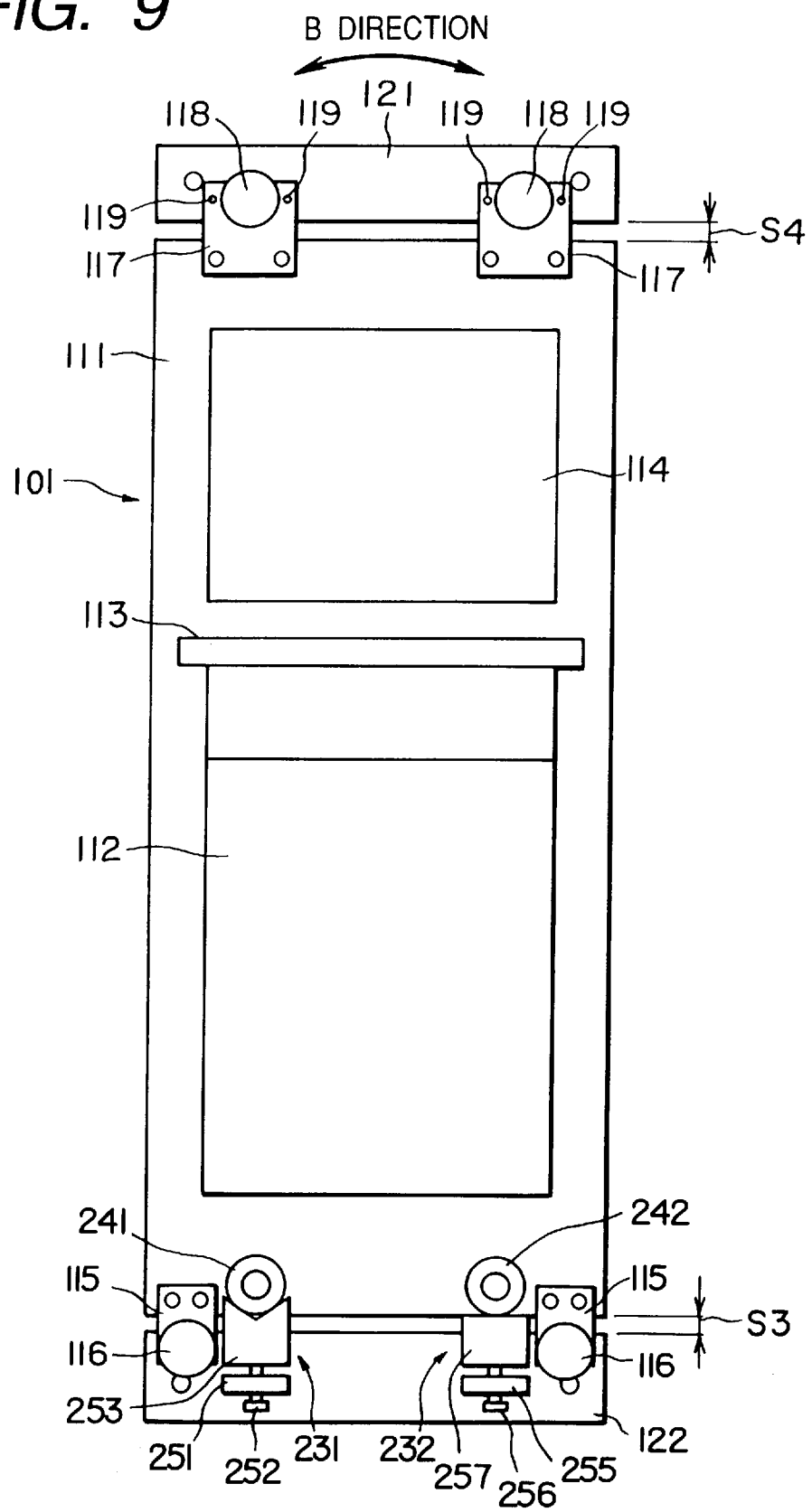
FIG. 9 is a front view showing the load port and the load port mounting portion of the semiconductor manufacture apparatus according to a third embodiment of the present invention.
Figure 10:
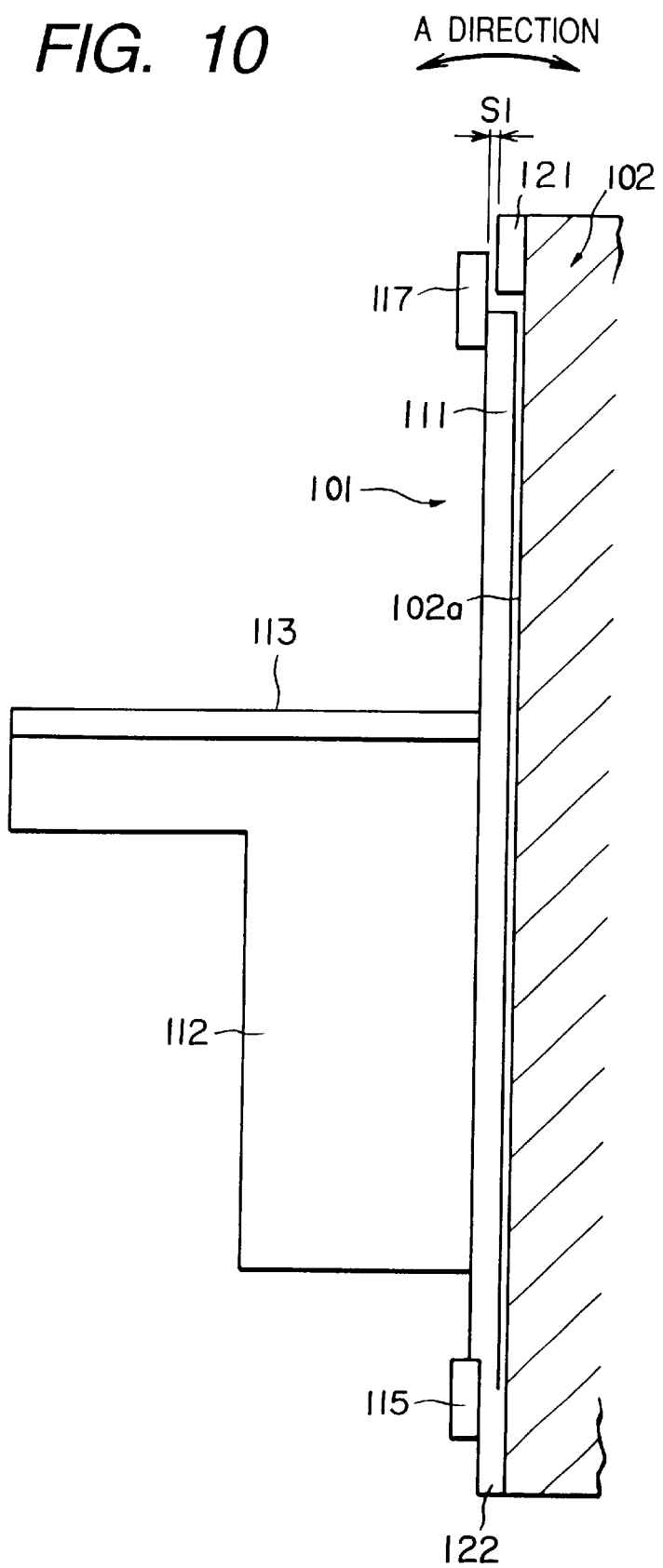
FIG. 10 is a side elevational view showing the load port and the load port mounting portion of the semiconductor manufacture apparatus according to the third embodiment of the present invention.

Subsequently, a third embodiment of the present invention is shown in FIGS. 9 and 10. FIG. 9 is a frontal view showing the load port and the load port mounting portion of the semiconductor manufacture apparatus as the third embodiment of the present invention, and FIG. 10 is a side elevational view thereof. Since this embodiment is substantially the same as the second embodiment except for some portions, the same reference numerals are used to indicate the like components and the explanation thereof will be omitted.

The difference between the third embodiment and the second embodiment is the lower positioning mechanism. In the second embodiment shown in FIGS. 6 and 7, the rollers 141 and 142 are provided on the semiconductor manufacture apparatus and the first and second positional adjustment mechanisms 131 and 132 are provided on the side of the load port, whereas, in the third embodiment shown in FIGS. 9 and 10, the rollers 241 and 242 are provided on the load port and the first and second positional adjustment mechanisms 231 and 232 that cooperate with these rollers are provided on the semiconductor manufacture apparatus.

More specifically, the first positioning mechanism is composed of a first roller (first positioning member) 241 mounted rotatably on a base plate 111 of the load port and a first positional adjustment mechanism 231 provided on the lower plate 122 of the semiconductor manufacture apparatus. The first positional adjustment mechanism includes a screw bracket 251 fixed to the lower plate 122 of the semiconductor manufacture apparatus 102, an adjustment screw 252 screwed with the screw bracket 251, and a first movable member 253. The first roller 241 rides over the first movable member and comes into contact with the first movable member to serve as a first positioning member for determining the positional relationship between the load port 101 and the semiconductor manufacture apparatus 102.

A head portion of the adjustment screw 252 is hexagonal, for example, and may be turned by a hexagonal wrench. The adjustment screw 252 is moved up and down by rotation. The first movable member 253 is guided to move only in the up-and-down direction by a guide (not shown) so that the up-and-down position thereof may be changed in response to the advance or retraction of the adjustment screw 252.

A V-shaped groove is provided in the upper surface of the first movable member 251. When the load port 101 is to be mounted on the semiconductor manufacture apparatus 102, the roller 241 is fitted into the V-shaped groove.

In the same manner as in the first positioning mechanism, the second positioning mechanism is composed of a second roller 242 (second positioning member) on the load port 101 and a second positional adjustment mechanism 232 on the semiconductor manufacture apparatus 102. The second positional adjustment mechanism includes a screw bracket 255, an adjustment screw 256 and a second movable member 257. The second roller 242 rides over the first movable member 257 and contact therewith to serve as a second positioning member for determining the positional relationship between the load port and the semiconductor manufacture apparatus. The structure of the second positional adjustment mechanism is substantially the same as that of the first positional adjustment mechanism. The only difference is that the V-shaped groove is formed in the top surface of the first movable member 253 of the first positional adjustment mechanism, whereas the top surface of the second movable member 257 is flat.

A head portion of the adjustment screw 256 is hexagonal, for example, and may be turned by a hexagonal wrench. The adjustment screw 256 is moved up and down by rotation. The second movable member 257 is guided to move only in the up-and-down direction by a guide (not shown) so that the up-and-down position thereof may be changed in response to the advance or retraction of the adjustment screw 256. (Incidentally, in FIG. 10, the first and second positioning mechanisms are omitted.)

In the structure of the third embodiment, a tilt adjusting mechanism (a tilt adjustment screw 118 or the like) which is the same as that in the second embodiment is also provided on the upper portion of the load port 101 for adjusting a tilt of a surface of the semiconductor manufacture apparatus on which the load port is to be mounted (the A-direction in FIG. 10).

In the above-described third embodiment of the invention, the steps for mounting the load port 101 onto the semiconductor manufacture apparatus will now be described.

When the load port 101 that has been carried by the carrier with wheels is mounted on the semiconductor manufacture apparatus 102, the first and second rollers 241 and 242 provided on the load port ride over the first and second movable members 253 and 257 in the positioning mechanisms provided on the lower portion of the semiconductor manufacture apparatus 102, respectively. In this case, the first roller 241 is adapted to be fitted into the V-shaped groove of the upper portion of the first movable member 253. Since the rollers 241 and 242 are rotatable about their own shafts, even if the load port 101 and the semiconductor manufacture apparatus 102 are somewhat offset from each other in the lateral direction, the rollers rotate along and on the first and second movable members to thereby cause the roller 241 to readily enter the V-shaped groove of the first movable member to bring the load port 101 into a suitable position. Thus, the load port 101 is suitably positioned in the horizontal direction relative to the semiconductor manufacture apparatus 102 and is also positioned in the vertical direction substantially in the suitable position. However, there are differences or individualities among the load ports or the semiconductor manufacture apparatus, as a matter of fact, the further positional adjustment is to be effected in order to align the levels of the horizontal reference surface of the load port with the horizontal reference surface of the semiconductor manufacture apparatus.

In this case, first of all, the adjustment screw 252 on the side of the first positional adjustment mechanism 231 is caused to turn by using a wrench or the like, to adjust the height of the first movable member 253 to adjust the height of the load port 101 relative to the semiconductor manufacture apparatus 102. Subsequently, the adjustment screw 256 of the second positional adjustment mechanism 232 is rotated to change the height of the second movable member 257 to adjust the tilt of the load port 101. This is the adjustment of the tilt in the direction indicated by the arrow B in FIG. 9. As shown in FIG. 9, under the condition that the rollers 241 and 242 ride over the first movable member 253 and the second movable member 257, respectively, minute gaps S3 and S4 are formed between the upper and lower plates 121 and 122 of the semiconductor manufacture apparatus 102 and the upper and lower portions of the base plate 111 of the load port 101. Thus, the fine adjustment of the relative position between the load port 101 and the semiconductor manufacture apparatus 102 by the first and second positional adjustment mechanism is possible. More specifically, the gaps S3 and S4 are set at, for example, 2 millimeters.

The A-direction adjustment screw of the upper portion is rotated to thereby effect the tilt in the A-direction after the above-described adjustment has been completed or before the above-described adjustment has been completed.

When the above-described three kinds of adjustments, i.e., the height adjustment by the adjustment screw 252, the B-direction adjustment by the adjustment screw 256 and the A-direction adjustment by the screw 119 are completed to thereby position correctly the load port 101 and the semiconductor manufacture apparatus 102, then, the screw handles 116 and 118 at the four positions are manually rotated and inserted into the screw holes (not shown) of the lower and upper plates 115 and 117 of the semiconductor manufacture apparatus 102 to fix the load port 101 to the semiconductor manufacture apparatus 102.

In the third embodiment, since the positional adjustment mechanisms for performing the fine adjustment of the relative position between the load port and the semiconductor manufacture apparatus are provided on the semiconductor manufacture apparatus side, it is advantageous to dispense with the work of the adjustment with the positional adjustment mechanisms in the case where the same kind of the load ports are continuously mounted (that is, the load port is to be replaced by the same kind of the load port).

In the above-described second and third embodiments, the first and second movable member are moved and positionally adjusted by the adjustment screws. However, it is possible to use any other means to move the movable members.

Also, in the foregoing second and third embodiments, since the load port is fixed to the semiconductor manufacture apparatus by using the screw handles, it is advantageous that the fixture is performed manually without using any tool. However, it is possible to perform the fixture between the load port and the semiconductor manufacture apparatus by using any other means such as bolts without using the screw handles. Also, it is possible to perform the tentative fixture with the screw handles and the final fixture with the bolts.

Also, in the second and third embodiments, the tilt adjustment mechanism (the mechanism for adjusting the tilt in the A-direction of FIGS. 7 and 10) is provided in the upper portion of the load port. However, this is not an essential component of the present invention but the positional adjustment may be effected only with the lower positioning mechanism.

Also, in the foregoing second embodiment, the two rollers are provided on the side of the semiconductor manufacture apparatus and the two positional adjustment mechanisms in cooperation with the rollers are provided on the side of the load port, and in the third embodiment, the two rollers are provided on the load port side and the two positional adjustment mechanisms are provided on the side of the semiconductor manufacture apparatus. However, the arrangement of the rollers and the positional adjustment mechanisms is not limited thereto or thereby. One roller may be provided for each of the side of the load port and the semiconductor manufacture apparatus and one positional adjustment mechanism in cooperation with the associated roller may be provided for each of the load port and the semiconductor manufacture apparatus. (For example, the first roller and the second positional adjustment mechanism are provided on the side of the load port and the second roller and the first positional adjustment mechanism are provided on the side of the semiconductor manufacture apparatus.)

Also, in the positioning mechanisms of the foregoing second and third embodiments, the first and second positioning members that are brought into contact with the first and second movable members are constructed as rotatable rollers. With such a structure, it is advantageous that the horizontal positioning may be performed smoothly when the load port is to be mounted on the semiconductor manufacture apparatus. However, the members are not necessarily constructed as the rollers. For example, it is possible to perform the adjustment in the B-direction explained in the embodiments even with the structure that the second roller is formed into a simple non-rotatable circular member that contact with the second movable member. Also, it is possible to use a rectangular or any other shaped member that is in surface contact with the second movable member, instead of the second roller. Also with respect to the first roller, it is possible to use a non-rotatable circular member or a member with a V-shaped surface that engages with the V-shaped groove of the first movable member.

Also, in the foregoing second and third embodiments, the bottom surface of the V-shaped groove of the movable member is formed into the V-shaped groove defined by two flat surfaces. However, the form of the V-shaped groove may be formed in any other form, for example, a groove whose bottom surface is curved.

What is claimed is:

1. A load port mounting mechanism for a semiconductor manufacture apparatus, comprising:
   a positioning plate fixed to a load port and having a planar positioning surface at a bottom surface; and
   a plate receiver fixed to the semiconductor manufacture apparatus and having a planar positioning surface at a top surface,
   wherein when the load port is to be mounted on the semiconductor manufacture apparatus in a single alignment step, said positioning plate rides over said plate receiver in order that the planar positioning surface of said positioning plate engages with the planar positioning surface of said plate receiver so that the load port is positionally aligned with the semiconductor manufacture apparatus in a vertical direction.

2. The load port mounting mechanism according to claim 1, further comprising a positioning guide fixed to the load port mounting surface of the semiconductor manufacture apparatus and having a pair of positioning surfaces opposed to each other and disposed at an interval in a horizontal direction, wherein said positioning plate has horizontally positioning surfaces at both ends in the horizontal direction of said positioning surfaces of said second positioning guide, and the positioning surfaces at both ends of said positioning plate are brought into contact with the opposed positioning surfaces of said positioning guide so that the load port is further positioned in the horizontal direction relative to the semiconductor manufacture apparatus.

3. The load port mounting mechanism according to claim 2, further comprising:
   a positioning plate fixed at a position above a position where said first positioning device is fixed to the semiconductor manufacture apparatus mounting surface of the load port and having positioning surfaces at both ends thereof in the horizontal direction; and
   a positioning guide fixed at a position above said first positioning guide to the load port mounting surface of the semiconductor manufacture apparatus and having a pair of positioning surfaces opposed to each other and disposed at an interval in the horizontal direction,
   wherein when the load port is to be mounted on the semiconductor manufacture apparatus, said second positioning plate is fitted between a pair of opposed positioning surfaces of said second positioning guide, and the positioning surfaces at both ends of said second positioning plate are brought into contact with the opposed positioning surfaces of said second positioning guide so that the load port is further positioned in the horizontal direction relative to the semiconductor manufacture apparatus.

4. The load port mounting mechanism according to claim 1, wherein said load port has a pair of carrier wheels on the bottom surface of the load port.

5. The load port mounting mechanism according to claim 4, wherein the load port has carrier handles that may be manually gripped when the load port is to be manually carried by using said carrier wheels.

6. The load port mounting mechanism according to claim 1, further comprising:
   a fixture handle provided on the load port and having a shaft portion around which a screw thread is formed and a handle portion connected to said shaft portion; and
   a screw hole which can be threadedly engaged with said shaft portion around which the screw thread is formed and provided on the side of the semiconductor manufacture apparatus,
   wherein said shaft portion is threadedly engaged with said screw hole by manually operating said fixture handle so that the load port may be fixed to said semiconductor manufacture apparatus.

7. A load port mounting mechanism for a semiconductor manufacture apparatus, comprising:
   a positioning plate fixed to one of a load port and a semiconductor manufacture apparatus, and having planar positioning surfaces at both ends in a horizontal direction; and
   a positioning guide fixed to the other of the load port and the semiconductor manufacture apparatus, and having a pair of planar positioning surfaces disposed at an interval in the horizontal direction and opposed to each other,
   wherein when the load port is to be mounted on the semiconductor manufacture apparatus in a single alignment step, said planar positioning plate is fitted between the pair of planar positioning surfaces opposed to each other and the planar positioning surfaces at both ends of said positioning plate are engaged with an opposed planar positioning surfaces of said positioning guide so that the load port is positioned in the horizontal direction relative to the semiconductor manufacture apparatus.

8. The load port mounting mechanism according to claim 7, further comprising:
   a fixture handle provided on the load port and having a shaft portion around which a screw thread is formed and a handle portion connected to said shaft portion; and
   a screw hole which can be threadedly engaged with said shaft portion around which the screw thread is formed and provided on the side of the semiconductor manufacture apparatus,
   wherein said shaft portion is threadedly engaged with said screw hole by manually operating said fixture handle so that the load port may be fixed to said semiconductor manufacture apparatus.

9. A load port mounting position adjusting mechanism for adjusting a position where a load port is to be mounted on a semiconductor manufacture apparatus, comprising:
   a first positioning member provided in one of the load port and the semiconductor manufacture apparatus;
   a first movable member movable in an up-and-down direction and provided in the other one of the load port and the semiconductor manufacture apparatus than the one provided with said first positioning member;
   a first positional adjustment mechanism for adjusting a position of said first movable member in the up-and-down direction;
   a second positioning member provided in one of the load port and the semiconductor manufacture apparatus;
   a second movable member movable in the up-and-down direction provided in the other one of the load port and the semiconductor manufacture apparatus than the one provided with said second positioning member; and
   a second positional adjustment mechanism for adjusting a position of said second movable member in the up-and-down direction,
   wherein when the load port is mounted on the semiconductor manufacture apparatus, said first movable member and said second movable member are brought into contact with said first positioning member and said second positioning member, respectively, and a groove into which said first positioning member is to be fitted is formed in a surface of said first movable member in contact with said first positioning member.

10. The load port mounting mechanism according to claim 9, wherein said first and second positioning members are rollers that may rotate about their own shafts.

11. The load port mounting position adjusting mechanism according to claim 9, wherein said first and second positioning members are provided in the load port and said first and second movable members are provided in the semiconductor manufacture apparatus.

12. The load port mounting position adjusting mechanism according to claim 9, wherein the load port has a tilt adjusting mechanism for adjusting a tilt of a surface of the load port to be mounted on the semiconductor manufacture apparatus.

13. A load port to be mounted on a semiconductor manufacture apparatus, comprising:
   a base plate;
   a first movable member movable in an up-and-down direction relative to said base plate;
   a first positional adjustment mechanism for adjusting a position of said first movable member in the up-and-down direction;
   a second movable member movable in the up-and-down direction relative to said base plate; and
   a second positional adjustment mechanism for adjusting a position of said second movable member in the up-and-down direction,
   wherein when the load port is to be mounted on the semiconductor manufacture apparatus, said first movable member and said second movable member are adapted to contact with a first positioning member and a second positioning member provided in the semiconductor manufacture apparatus, respectively, and a groove into which said first positioning member is to be fitted is formed in a surface of said first movable member which contacts with said first positioning member.

14. A load port to be mounted on a semiconductor manufacture apparatus, comprising:
   a base plate;
   a movable member movable in an up-and-down direction relative to said base plate; and
   a positional adjustment mechanism for adjusting a position of said movable member in the up-and-down direction,
   wherein when the load port is to be mounted on the semiconductor manufacture apparatus, said movable member is adapted to contact with a positioning member provided on the semiconductor manufacture apparatus, and a groove into which said positioning member is to be fitted is formed in a surface of said movable member which contacts with said positioning member.

15. A semiconductor manufacture apparatus on which a load port is to be mounted, comprising:
   a housing having a load port mounting surface;
   a first movable member movable in an up-and-down direction relative to said housing;
   a first positional adjustment mechanism for adjusting a position of said first movable member in the up-and-down direction
   a second movable member movable in the up-and-down direction relative to said housing; and
   a second positional adjustment mechanism for adjusting a position of said second movable member in the up-and-down direction,
   wherein when the load port is to be mounted on the semiconductor manufacture apparatus, said first movable member and said second movable member are adapted to contact with a first positioning member and a second positioning member provided on the load port, respectively, and a groove into which said first positioning member is to be fitted is formed in a surface of said first movable member which contacts with said first positioning member.

16. A semiconductor manufacture apparatus on which a load port is to be mounted, comprising:
   a housing having a load port mounting surface;
   a movable member movable in an up-and-down direction relative to said housing; and
   a positional adjustment mechanism for adjusting a position of said movable member in the up-and-down direction,
   wherein when the load port is to be mounted on the semiconductor manufacture apparatus, said movable member is adapted to contact with a positioning member provided on the load port, and a groove into which said positioning member is to be inserted is formed in a surface of said movable member which contacts with said positioning member.

17. A load port mounting position adjusting method for adjusting a position where a load port is to be mounted on a semiconductor manufacture apparatus for the load port and the semiconductor manufacture apparatus,
   said load port and semiconductor manufacture apparatus including:
      a first positioning member provided on one of the load port and the semiconductor manufacture apparatus;
      a first movable member movable in an up-and-down direction and provided on the other one of the load port and the semiconductor manufacture apparatus than the one where said first positioning member is provided;

a first positional adjustment mechanism for adjusting a position of said first movable member in the up-and-down direction;

a second positioning member provided in one of the load port and the semiconductor manufacture apparatus;

a second movable member movable in the up-and-down direction provided on the other one of the load port and the semiconductor manufacture apparatus than the one provided with said second positioning member; and a second positional adjustment mechanism for adjusting a position of said second movable member in the up-and-down direction, wherein when the load port is mounted on the semiconductor manufacture apparatus, said first movable member and said second movable member are brought into contact with said first positioning member and said second positioning member, respectively, and a groove into which said first positioning member is to be inserted is formed in a surface of said first movable member which contacts with said first positioning member, said method comprising:

moving said first movable member in the up-and-down direction by said first positional adjustment mechanism to adjust the height of the load port relative to the semiconductor manufacture apparatus; and moving said first movable member in the up-and-down direction by said second positional adjustment mechanism to adjust a tilt of the load port relative to the semiconductor manufacture apparatus.

* * * * *

UNITED STATES PATENT AND TRADEMARK OFFICE
CERTIFICATE OF CORRECTION

PATENT NO. : 6,883,770 B1
DATED : April 26, 2005
INVENTOR(S) : Miyajima et al.

It is certified that error appears in the above-identified patent and that said Letters Patent is hereby corrected as shown below:

Title page,
Item [56], References Cited, please add the following:
-- U.S. PATENT DOCUMENTS,
5,139,459    08/1992 Tetsuo TAKAHASHI, et al. 454/187
5,364,219    11/1994 Tetsuo TAKAHASHI, et al. 414/217 --; and
-- FOREIGN PATENT DOCUMENTS,
JP 2525284  05/31/1996
JP 63-28047  02/05/1988
JP2722306  11/28/1997
JP 2757102  03/13/1998
JP 2850279  11/13/1998
JP 9-246351  09/19/1997
JP 10-56050  02/24/1998
JP 10-321695  12/04/1998 --.

Signed and Sealed this

Twenty-seventh Day of September, 2005

JON W. DUDAS
*Director of the United States Patent and Trademark Office*